United States Patent
Zhang et al.

(10) Patent No.: US 10,651,890 B2
(45) Date of Patent: May 12, 2020

(54) DEVICE AND METHOD FOR WIRELESS COMMUNICATION AND COMMUNICATION TERMINAL

(71) Applicant: Sony Corporation, Tokyo (JP)

(72) Inventors: Zaichen Zhang, Nanjing (CN); Rong Zeng, Nanjing (CN)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/572,575

(22) PCT Filed: May 13, 2016

(86) PCT No.: PCT/CN2016/082012
§ 371 (c)(1),
(2) Date: Nov. 8, 2017

(87) PCT Pub. No.: WO2016/184362
PCT Pub. Date: Nov. 24, 2016

(65) Prior Publication Data
US 2018/0131404 A1    May 10, 2018

(30) Foreign Application Priority Data

May 15, 2015   (CN) .......................... 2015 1 0250571

(51) Int. Cl.
*H04B 1/7117*    (2011.01)
*H04B 7/08*      (2006.01)
(Continued)

(52) U.S. Cl.
CPC ....... *H04B 1/7117* (2013.01); *H03H 17/0255* (2013.01); *H04B 1/7105* (2013.01); *H04B 1/7113* (2013.01); *H04B 7/0842* (2013.01)

(58) Field of Classification Search
CPC .. H04B 1/7117; H04B 7/0842; H04B 1/7105; H04B 1/7113; H03H 17/0255
See application file for complete search history.

(56) References Cited

U.S. PATENT DOCUMENTS

2002/0054621 A1*  5/2002  Kyeong ................... H04B 7/01
375/147
2004/0213187 A1  10/2004  Fujil
(Continued)

FOREIGN PATENT DOCUMENTS

CN         1829119 A      9/2006
CN       101267236 A      9/2008
(Continued)

OTHER PUBLICATIONS

International Search Report dated Jul. 28, 2016 in PCT/CN2016/082012 filed May 13, 2016.

*Primary Examiner* — Syed Haider
*Assistant Examiner* — Amneet Singh
(74) *Attorney, Agent, or Firm* — Xsensus LLP

(57) ABSTRACT

The present disclosure provides a device and method for wireless communication and a communication terminal. The device comprises: a spatial filtering unit, configured to perform spatial filtering on a signal received by each antenna in a receiving antenna array, and combine filtered signals, wherein all coefficients adopted by spatial filtering are configured to reduce an equivalent channel time-variant degree of a combined signal.

7 Claims, 6 Drawing Sheets

(51) Int. Cl.
*H03H 17/02* (2006.01)
*H04B 1/7105* (2011.01)
*H04B 1/7113* (2011.01)

(56) References Cited

U.S. PATENT DOCUMENTS

| | | | | |
|---|---|---|---|---|
| 2006/0073801 | A1* | 4/2006 | Wang | H04B 7/0857 455/226.1 |
| 2008/0089432 | A1* | 4/2008 | Park | H04B 7/0413 375/260 |
| 2008/0170554 | A1 | 7/2008 | Wang et al. | |
| 2012/0263245 | A1* | 10/2012 | Carbonelli | H04L 25/0232 375/260 |
| 2013/0094349 | A1* | 4/2013 | Hoshino | H04L 1/1893 370/216 |
| 2013/0114756 | A1* | 5/2013 | Jia | H04J 11/00 375/295 |
| 2016/0227462 | A1* | 8/2016 | Axmon | H04W 36/32 |
| 2017/0111954 | A1* | 4/2017 | Wilhelmsson | H04W 64/006 |

FOREIGN PATENT DOCUMENTS

| | | | |
|---|---|---|---|
| CN | 101741450 | A | 6/2010 |
| CN | 102970067 | A | 3/2013 |
| EP | 1 471 663 | A2 | 10/2004 |

\* cited by examiner

| $n_r$ | 4 | 8 | 16 |
|---|---|---|---|
| $\theta_0$ | 90 | 90 | 90 |
| $\theta_1$ | 144.9 | 125.1 | 112.7 |
| $\theta_2$ | 180 | 145.7 | 125.8 |
| $\theta_3$ | 215.1 | 163.4 | 136.7 |
| $\theta_4$ | 270 | 180 | 146.3 |
| $\theta_5$ | | 196.6 | 155.1 |
| $\theta_6$ | | 214.3 | 163.4 |
| $\theta_7$ | | 234.3 | 171.7 |
| $\theta_8$ | | 270 | 180 |
| $\theta_9$ | | | 188.4 |
| $\theta_{10}$ | | | 196.6 |
| $\theta_{11}$ | | | 204.9 |
| $\theta_{12}$ | | | 213.7 |
| $\theta_{13}$ | | | 223.3 |
| $\theta_{14}$ | | | 234.2 |
| $\theta_{15}$ | | | 247.3 |
| $\theta_{16}$ | | | 270 |

Figure 6

DEVICE AND METHOD FOR WIRELESS COMMUNICATION AND COMMUNICATION TERMINAL

The present application claims the priority to Chinese Patent Application No. 201510250571.5, titled "DEVICE AND METHOD FOR WIRELESS COMMUNICATION AND COMMUNICATION TERMINAL", filed on May 15, 2015 with the State Intellectual Property Office of People's Republic of China, which is incorporated herein by reference in its entirety.

FIELD OF THE INVENTION

Embodiments of the present disclosure generally relate to the field of wireless communications, and in particular to an apparatus and a method for decreasing a time-variant degree of a wireless channel.

BACKGROUND OF THE INVENTION

Presently, for a broadband wireless mobile communication system, a system performance at a middle or low movement speed is mainly concerned. However, with the development of the modern transportation technology, in some special occasions such as a high-speed railway (a current speed up to 350 km/h), it is required to achieve high-speed transmission of data in a rapid movement condition. In this case, there are many problems for an existing wireless transmission technology in the high-speed movement environment, and a fast time-variant channel generates a great impact on a system performance. Therefore, it is expected to eliminate or reduce the influence from the fast time-variant channel in receiving, for example, by simple and accurate channel estimation or the like.

SUMMARY

In the following, an overview of the present invention is given simply to provide basic understanding to some aspects of the present invention. It should be understood that this overview is not an exhaustive overview of the present invention. It is not intended to determine a critical part or an important part of the present invention, nor to limit the scope of the present invention. An object of the overview is only to give some concepts in a simplified manner, which serves as a preface of a more detailed description described later.

According to an aspect of the present application, an apparatus for wireless communications is provided. The apparatus includes: a spatial filtering unit, configured to perform spatial filtering on signals received by each of antennas in a receiving antenna array, and combine the filtered signals, wherein coefficients used by the spatial filtering are configured such that an equivalent channel time-variant degree for the combined signal is decreased.

According to another aspect of the present application, a method for wireless communications is further provided. The method includes: performing spatial filtering on signals received by each of antennas in a receiving antenna array, and combining the filtered signals, wherein coefficients used by the spatial filtering are configured such that an equivalent channel time-variant degree for the combined signal is decreased.

According to another aspect of the present application, a communication terminal is further provided, which includes the apparatus described above.

According to another aspect of the present application, an apparatus for wireless communications is further provided. The apparatus includes: a receiving unit, configured to receive, from a device in communication with the apparatus, receiving antenna configuration information of the device; a coefficient determination unit, configured to determine spatial filtering coefficients corresponding to the receiving antenna configuration; and a transmitting unit, configured to transmit the spatial filtering coefficients to the device.

According to other aspects of the present disclosure, there are also provided computer program codes and computer program products for implementing the above mentioned methods for wireless communications and a computer readable storage medium in which computer program codes for implementing the above methods for wireless communications are recorded.

With the apparatus and method for wireless communications according to the present application, an equivalent channel time-variant degree can be decreased by spatial filtering, thereby improving the system performance.

These and other advantages of the present disclosure will be more apparent by illustrating in detail a preferred embodiment of the present invention in conjunction with accompanying drawings below.

BRIEF DESCRIPTION OF THE DRAWINGS

To further set forth the above and other advantages and features of the present invention, detailed description will be made in the following taken in conjunction with accompanying drawings in which identical or like reference signs designate identical or like components. The accompanying drawings, together with the detailed description below, are incorporated into and form a part of the specification. It should be noted that the accompanying drawings only illustrate, by way of example, typical embodiments of the present invention and should not be construed as a limitation to the scope of the invention. In the accompanying drawings:

FIG. 6 shows an example of an optimized numerical calculation result;

DETAILED DESCRIPTION OF EMBODIMENTS

An exemplary embodiment of the present invention will be described hereinafter in conjunction with the accompanying drawings. For the purpose of conciseness and clarity, not all features of an embodiment are described in this specification. However, it should be understood that multiple decisions specific to the embodiment have to be made in a process of developing any such embodiment to realize a particular object of a developer, for example, conforming to those constraints related to a system and a business, and these constraints may change as the embodiments differs. Furthermore, it should also be understood that although the development work may be very complicated and time-consuming, for those skilled in the art benefiting from the present disclosure, such development work is only a routine task.

Here, it should also be noted that in order to avoid obscuring the present invention due to unnecessary details, only a device structure and/or processing steps closely related to the solution according to the present invention are illustrated in the accompanying drawing, and other details having little relationship to the present invention are omitted.

<First Embodiment>

Figure 1:
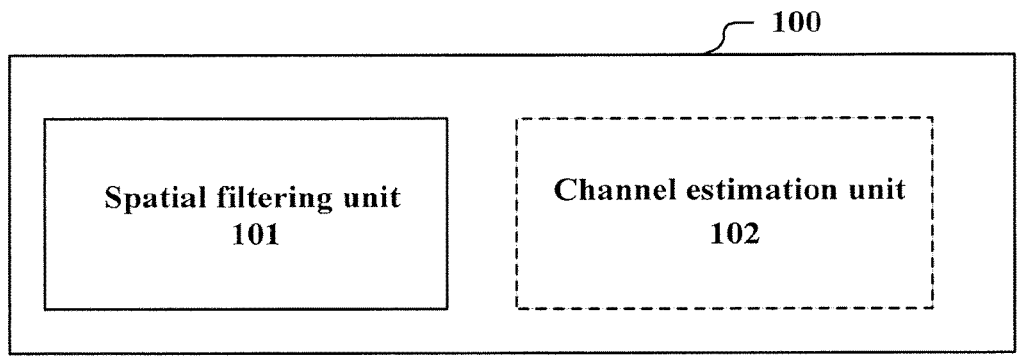
FIG. 1 is a block diagram illustrating a structure of an apparatus for wireless communications according to an embodiment of the present application.

FIG. 1 shows a block diagram of a structure of an apparatus 100 for wireless communications according to an embodiment of the present application. The apparatus 100 includes: a spatial filtering unit 101, configured to perform spatial filtering on signals received by each of antennas in a receiving antenna array, and combine the filtered signals. Coefficients used by the spatial filtering are configured such that an equivalent channel time-variant degree for the combined signal is reduced.

For example, the apparatus 100 may be a user equipment or may be located in the user equipment. The user equipment may be, for example, a mobile terminal (such as a smartphone, a tablet personal computer (PC), a notebook PC, a portable game terminal, a portable/dongle mobile router and a digital camera) or an in-vehicle terminal (such as a car navigation apparatus) served by a base station. The user equipment may also be realized as a terminal (that is also referred to as a machine type communication (MTC) terminal) that performs machine-to-machine (M2M) communication. Furthermore, the user equipment may be a radio communication module (such as an integrated circuit module including a single die) mounted on each of the above mentioned terminals. Moreover, in the case that another communication device such as a relay base station or a small base station needs to acquire information from another base station to the present base station, such a communication device may also be regarded as the user equipment herein.

As described above, when the apparatus 100 is in a high-speed movement state relative to the base station, a channel between the apparatus 100 and the base station is a fast time-variant channel. The apparatus 100 according to the present application performs spatial filtering on the signals by the spatial filtering unit 101 to decrease an equivalent channel time-variant degree, thereby mitigating impact on the system performance. The equivalent channel time-variant degree is related to a spread degree of an angle of arrival.

Specifically, for example, in the case that the receiving antenna array includes $n_r$ antennas, signals received by each of the antennas are filtered with one spatial filter, and the coefficients of each of the spatial filters are configured so that the equivalent channel time-variant degree for the signal obtained after combining the filtered signals is decreased.

Furthermore, as indicated by a dashed line box in FIG. 1, the apparatus 100 may further include: a channel estimation unit 102, configured to estimate parameters of the equivalent channel by using the combined signal as a signal obtained through a time-invariant channel and using a time-invariant channel estimation algorithm. In other words, since the equivalent channel time-variant degree is reduced, the combined signal after spatial filtering may be approximately regarded as a signal obtained through the time-invariant channel, so that channel estimation may be performed by the time-invariant channel estimation algorithm with reduced complexity such as the least squares estimation algorithm, to obtain the parameters of the equivalent channel. The obtained parameters of the equivalent channel may be used to perform channel equalization, symbol detection and demodulation, or the like.

It should be understood that the apparatus according to the present application is not limited to be applied to a cellular mobile communication system and is not limited by existing wireless communication standards either, and may be applied to any communication system in which the receiving antenna is an array antenna.

<Second Embodiment>

Figure 2:
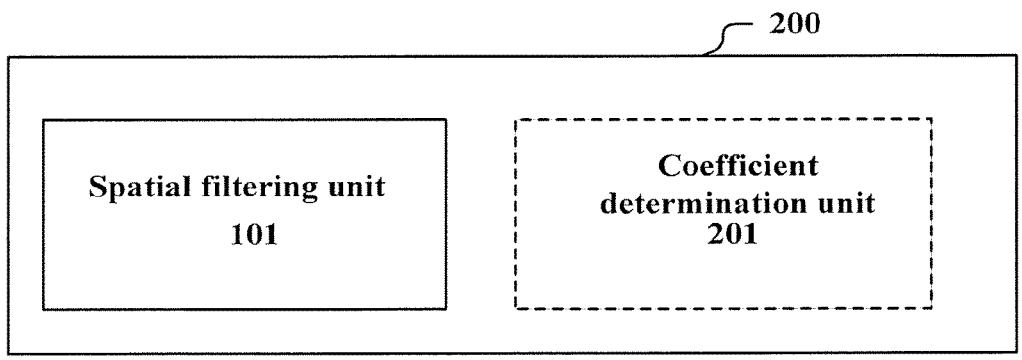
FIG. 2 is a block diagram illustrating a structure of an apparatus for wireless communications according to another embodiment of the present application.

FIG. 2 shows a block diagram of an apparatus 200 for wireless communications according to another embodiment of the present application. Besides the spatial filtering unit 101, the apparatus 200 further includes: a coefficient determination unit 201, configured to determine, based on a root-mean-square wavenumber spread of a signal which is spatial filtered and combined, coefficients used by the spatial filtering. Although not shown in FIG. 2, the apparatus 200 may also include the channel estimation unit 102 and so on.

Since the root-mean-square wavenumber spread of the combined signal reflects the time-variant degree of the equivalent channel, the coefficient determination unit 201 may determine the coefficients for the spatial filtering based on the root-mean-square wavenumber spread.

Figure 3:
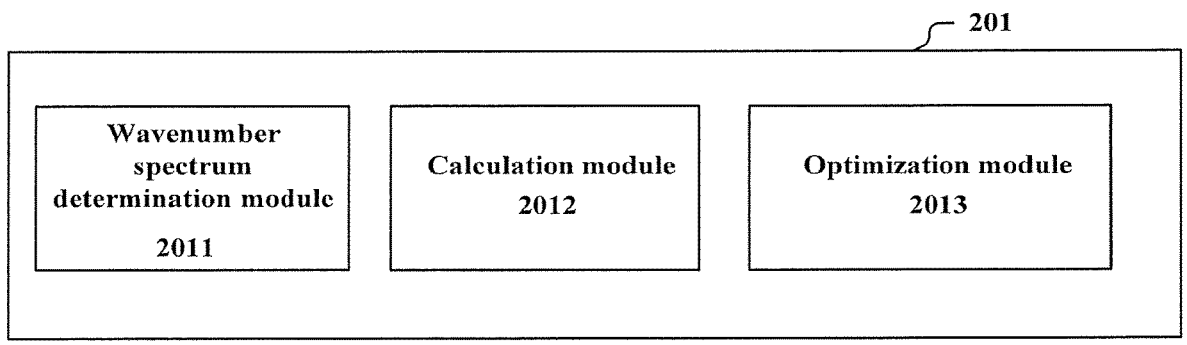
FIG. 3 is a block diagram illustrating a structure of a coefficient determination unit according to an embodiment of the present application.

As shown in FIG. 3, in an example, the coefficient determination unit 201 includes: a wavenumber spectrum determination module 2011, configured to determine a corresponding wavenumber spectrum according to a configuration of a receiving antenna array; a calculation module 2012, configured to calculate, based on the wavenumber spectrum, its root-mean-square wavenumber spread, and calculate, based on a principle that the spatial filtered signals are orthogonal to each other in an angle domain, the root-mean-square wavenumber spread of the combined signal; and an optimization module 2013, configured to obtain optimal spatial filtering coefficients by minimizing the root-mean-square wavenumber spread of the combined signal.

The configuration of the receiving antenna array includes, for example, a shape of the receiving antenna array, the number of antennas, an operating wavelength and the like. Different antenna array configurations correspond to different wavenumber spectrums. As an example, the wavenumber spectrum determination module 2011 determines the wavenumber spectrums according to the following equation (1).

$$S(k) = \rho(\theta)\left|\frac{d\theta}{dk}\right| = \frac{1}{\sqrt{k_0^2 - k^2}}\rho(\theta) = \frac{1}{k_0|\sin(\theta - \theta_R)|}\rho(\theta) \quad (1)$$

where k is a wavenumber, θ is an angle, S(k) is the wavenumber spectrum, ρ(θ) is an angular spectrum, $k_0 = 2\pi/\lambda$, λ is the operating wavelength, and $\theta_R$ is a motion direction angle of the mobile terminal.

The calculation module 2012 calculates the root-mean-square wavenumber spread of the spatial filtered signal based on the wavenumber spectrum. Firstly, a corresponding root-mean-square wavenumber spread is calculated by the following equation (2), for example.

$$\sigma_k^2 = \frac{\int_{-\infty}^{+\infty}(k-\bar{k})^2 S(k)dk}{\int_{-\infty}^{+\infty} S(k)dk} \quad \text{where} \quad (2)$$

$$\bar{k} = E[k] = \frac{\int_{-\infty}^{+\infty} kS(k)dk}{\int_{-\infty}^{+\infty} S(k)dk}.$$

Then, the root-mean-square wavenumber spread of the combined signal after the spatial filtering is calculated based on the principle that the spatial filtered signals are orthogonal to each other in the angular domain by using the root-mean-square wavenumber spread obtained through the equation (2). The optimization module 2013 optimizes the root-mean-square wavenumber spread with respect to the coefficients for the spatial filtering to minimize the root-mean-square wavenumber spread.

For example, the optimization module 2013 may obtain the optimal coefficients for spatial filtering by using a multi-objective constraint optimization method. Specifically, the optimization module 2013 may calculate parameters of respective angular spectrums based on a principle of minimizing the root-mean-square wavenumber spread of the combined signal by using the multi-objective constraint optimization method, and then calculate the optimal spatial filtering coefficients with the parameters of the respective angular spectrums by a phased array mode synthesis method. Practically, the optimization module 2013 may also use any existing multi-parameter optimization method, and the optimization method is not limited thereto.

Figure 4:
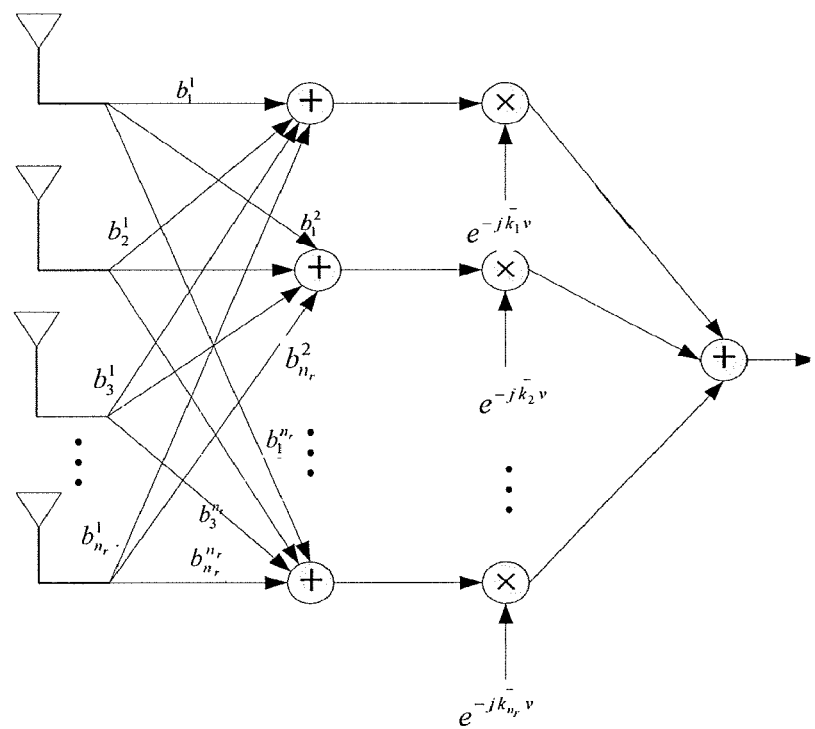
FIG. 4 is a schematic diagram illustrating a process of an example of spatial filtering according to an embodiment of the present application.

In addition, the spatial filtering unit 101 may also perform wavenumber spectrum shifting on the filtered signals before combining the filtered signals. FIG. 4 shows a schematic diagram of a process of spatial filtering according to an embodiment of the present application. It is assumed that the number of antennas is $n_r$, and FIG. 4 shows $n_r$ spatial filters. In FIG. 4, $b_q^n$ (q=1, 2, ... $n_r$; n=1, 2 ... $n_r$) is the q-th stage coefficient of the n-th spatial filter, and $\bar{k}_n$ (n=1, 2, ... $n_r$) is a center value of the wavenumber spectrum corresponding to the n-th spatial filter. The wavenumber spectrum is shifted by multiplying the filtered signal by a complex single-frequency signal of $e^{-j\bar{k}_n v}$.

Figure 5:
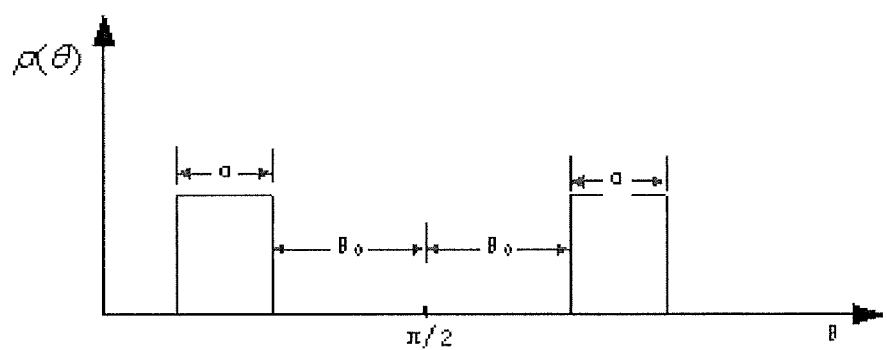
FIG. 5 is a schematic diagram illustrating an example of an angular spectrum corresponding to an isometric linear array.

In the following, it is described in detail by assuming that an array at a receiving end is an isometric linear array. An angular spectrum corresponding to the isometric linear array is shown in FIG. 5 and may be expressed as:

$$\rho(\theta) = \begin{cases} \frac{P_R}{2\alpha} & \frac{\pi}{2} - \theta_0 - \alpha \leq \theta \leq \frac{\pi}{2} - \theta_0, \frac{\pi}{2} + \theta_0 \leq \theta \leq \frac{\pi}{2} + \theta_0 + \alpha \\ 0 & \text{Others} \end{cases} \quad (3)$$

where α is a width of the angular spectrum, $P_R$ is a power of the received signal, and the received signal is, for example, a signal of which an angle of arrival is uniformly distributed between 0-2π, and $\theta_0$ is a starting offset angle of the angular spectrum.

Thus, firstly, the center value $\bar{k}$ of the wavenumber spectrum is calculated:

$$\bar{k} = E[k] = \frac{\int_{-\infty}^{+\infty} kS(k)dk}{\int_{-\infty}^{+\infty} S(k)dk} = \frac{k_0}{\alpha}[\sin(\theta_0 + \alpha) - \sin(\theta_0)]. \quad (4)$$

Based on the equation (4), the root-mean-square wavenumber spread $\sigma_k^2$ may be calculated as follows:

$$\sigma_k^2 = \frac{\int_{-\infty}^{+\infty}(k-\bar{k})^2 S_{\bar{h}}(k)dk}{\int_{-\infty}^{+\infty} S_{\bar{h}}(k)dk} = \quad (5)$$

$$k_0^2\left(\left[\frac{1}{2}\left(1 + \frac{1}{\alpha}(\sin(\alpha)\cos(2\theta_0 + \alpha))\right)\right] - \frac{1}{\alpha^2}[(\sin(\theta_0) - \sin(\theta_0 + \alpha))^2]\right).$$

It can be seen that the root-mean-square wavenumber spread is related to the width of the angular spectrum α and the starting offset angle of the angular spectrum $\theta_O$. The root-mean-square wavenumber spread $\sigma_{k,\bar{h}}^2$ of the combined signal is calculated:

$$\sigma_{k,\bar{h}}^2 = \frac{1}{\pi}\sum_{n=1}^{n_r} \alpha_n \sigma_{k,n}^2 \quad (6)$$

where $n_r$ is the number of receiving antennas, $\alpha_n$ is a width of the angular spectrum corresponding to the n-th spatial filter, $\sigma_{k,n}^2$ is a root-mean-square wavenumber spread corresponding to the n-th spatial filter, and $\theta_n$ is a starting offset angle of the angular spectrum corresponding to the n-th spatial filter. The optimization module 2013 minimizes the root-mean-square wavenumber spread of the combined signal, and due to $$\theta_0 = \frac{\pi}{2}, \theta_{n_r} = \frac{3\pi}{2}$$

and $\alpha_i = \theta_{i+1} - \theta_i$, it may be obtained that $$[\theta_1^{opt} \ \theta_2^{opt} \ \ldots \ \theta_{n_r-1}^{opt}] = \arg\min_{0<\theta_1<\ldots<\theta_{n_r-1}<\pi}\{\sigma_{k,\bar{h}}^2\} \quad (7)$$

where $\theta_n^{opt}$ is a starting offset angle of the angular spectrum corresponding to the n-th optimal spatial filter.

$\theta_n^{opt}$ may be calculated using the multi-objective constraint optimization method. FIG. 6 shows numerical calculation results obtained by using the trust region reflection algorithm as an example. For example, the algorithm may be referred to "A Trust Region Method Based on Interior Point Techniques for Nonlinear Programming" published by Byrd, R H et al., on Vol. 89, No. 1, pp. 149-185, Mathematical Programming, in 2000. After the starting offset angle $\theta_n^{opt}$ is obtained, the coefficients of the optimal spatial filter may be calculated by the commonly used linear array beam pattern synthesis method. For example, the optimal spatial filtering coefficients $b_q^n$ may be calculated by the Fourier series method, i.e.:

$$b_q^n = \Delta_r \int_{-1/2\Delta_r}^{1/2\Delta_r} U^n(u) e^{-j2\pi u q \Delta_r} du \qquad (8)$$

where $U^n(u)$ is an array beam pattern corresponding to the n-th optimal spatial filter, which may be determined by $\theta_n^{opt}$ and $\theta_{n-1}^{opt}$. As described above, $b_q^n$ is the q-th stage coefficient of the n-th optimal spatial filter.

As shown in FIG. 4, in this example, at the receiver end, the spatial filtering is firstly performed on the received signals with $b_q^n$, and then the wavenumber spectrum shifting is performed on the spatial filtered signals, i.e., multiplying the filtered signals by $$\exp\left(-j \frac{k_0 v}{\theta_n^{opt} - \theta_{n-1}^{opt}} [\sin(\theta_n^{opt}) - \sin(\theta_{n-1}^{opt})]\right),$$

(where $j=\sqrt{-1}$), and the signals on which the wavenumber spectrum shifting are performed are combined. Then time-invariant channel estimation may be performed by a channel estimation algorithm with less complexity (such as the least squares estimation algorithm), and symbol detection and demodulation are performed as needed.

In addition, in another example, the coefficient determination unit 201 may be further configured to determine, based on a root-mean-square angle spread of the combined signal, coefficients used by the spatial filtering.

Still taking the isometric linear array shown in FIG. 5 as an example, the root-mean-square angle spread $\sigma_{AS}^2$ corresponding to its angular spectrum is:

$$\sigma_{AS}^2 = \frac{1}{\alpha} \int_{\theta_0}^{\theta_0+\alpha} [f(\theta)]^2 d\theta \qquad (9)$$

Where $f(\theta) = \begin{cases} 2\pi + (\theta - \mu_\theta), & (\theta - \mu_\theta) < -\pi \\ (\theta - \mu_\theta), & |\theta - \mu_\theta| \leq \pi \\ 2\pi - (\theta - \mu_\theta), & (\theta - \mu_\theta) > \pi \end{cases}$, where $\mu_\theta$ is: $\qquad (10)$ $$\mu_O = \frac{1}{\alpha} \int_{\theta_0}^{\theta_0+\alpha} \theta \, d\theta \qquad (11)$$

The root-mean-square angle spread of the combined signal is calculated as follows:

$$\sigma_{AS,h}^2 = \frac{1}{\pi} \sum_{n=1}^{n_r} \alpha_n \sigma_{AS,n}^2; \qquad (12)$$

where $\sigma_{AS,n}^2$ is the root-mean-square angle spread corresponding to the n-th spatial filter, and other symbols the same as those in the equations (3) to (6) have the same definitions. Subsequent steps for optimization and combination may be the same as the calculation steps based on the root-mean-square wavenumber spread, which are not repeated here.

The above-described coefficient determination unit 201 may be configured to perform an off-line operation to determine the coefficients used by the spatial filtering in advance. Since the coefficients for the spatial filtering depend only on the receiving antenna configuration and the antenna array at the receiving end is usually fixed, it is not necessary to perform real-time computation, thereby greatly reducing the implementation complexity of the receiver. The coefficient determination unit 201 may calculate the coefficients for the spatial filtering, for example, at power-up, and then recalculate the coefficients only when the antenna configuration is changed.

In addition, the apparatus 200 may further include a storage apparatus for storing the coefficients for the spatial filtering. The coefficients may be calculated by the coefficient determination unit 201 as described above, or may be preset at the time of leaving the factory. In the latter case, the apparatus 200 may not include the above-described coefficient determination unit 201.

<Third Embodiment>

Figure 7:
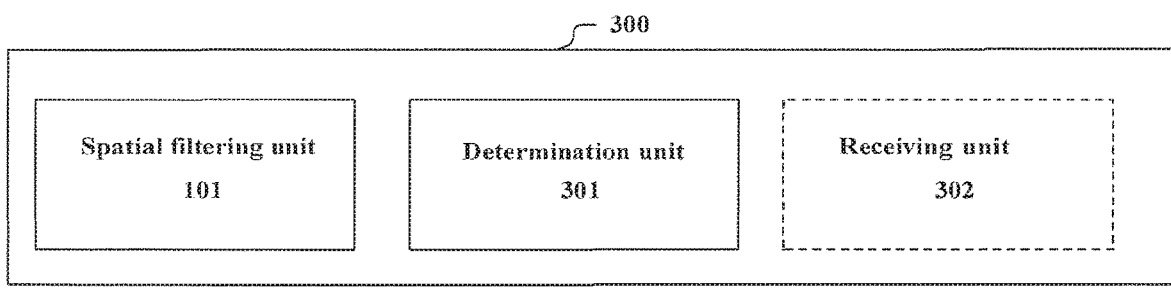
FIG. 7 is a block diagram illustrating a structure of an apparatus for wireless communications according to another embodiment of the present application.

FIG. 7 shows a block diagram of a structure of an apparatus 300 for wireless communications according to another embodiment of the present application. In addition to the spatial filtering unit 101, the apparatus 300 further includes a determination unit 301 configured to determine, based on a speed of the apparatus 300 relative to a device from which the signals are received, whether the spatial filtering unit 101 performs the spatial filtering processing.

As described above, when the relative motion speed between the mobile terminal and the base station is fast, the time-variant characteristics of the channel generate a significant impact on the system performance. In other words, when the relative motion speed is slow, the channel time-variant degree is low and generates a small impact on the system performance. Therefore, the improvement on the system performance produced by performing the spatial filtering is not significant. The determination unit 301 is configured to determine whether to perform the spatial filtering processing according to the relative speed. For example, the determination unit 301 determines to perform the spatial filtering processing only when the relative speed is greater than a certain threshold, to reduce a processing load of the receiver as much as possible.

For example, the above-mentioned speed may be determined based on a received reference signal.

Alternatively or as a supplement, the apparatus 300 may further include a receiving unit 302 configured to receive a trigger signal from a device from which the signals are received. The trigger signal triggers the spatial filtering unit 101 to perform the spatial filtering processing. That is, the base station side triggers the spatial filtering processing.

In an example, the trigger signal is generated based on a relative speed between the device from which the signals are received and the apparatus 300. For example, the relative speed is determined by the device according to a speed of the apparatus 300, which is acquired from the apparatus 300 or acquired from a communication network.

In addition, although an example where the coefficients of the spatial filters are calculated or stored on the apparatus 300 side is described in the second embodiment, these coefficients may be calculated or stored at the device side (for example, a base station) from which the apparatus 300 receives the signals. For example, the receiving unit 302 is configured to receive the spatial filtering coefficients corresponding to the receiving antenna array from the device. In this case, the apparatus 300 further includes a transmitting unit configured to transmit the configuration information of the receiving antenna array to the device.

It should be understood that although not shown in FIG. 7, the apparatus 300 may further include the aforementioned channel estimation unit 102 and/or the coefficient determination unit 201 and so on.

In the description of the above embodiments, a communication terminal is also disclosed actually, which includes any one of the apparatuses 100 to 300.

<Fourth Embodiment>

Figure 8:
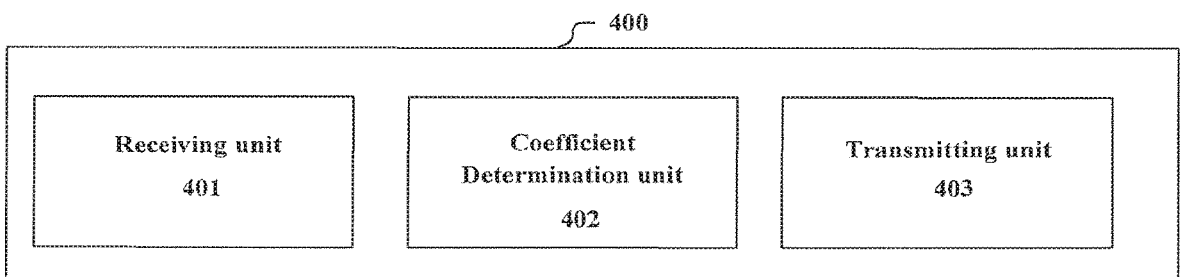
FIG. 8 is a block diagram illustrating a structure of an apparatus for wireless communications according to another embodiment of the present application.

FIG. 8 shows a block diagram of a structure of an apparatus 400 for wireless communications according to another embodiment of the present application. The apparatus 400 includes: a receiving unit 401, configured to receive, from a device in communication with the apparatus 400, receiving antenna configuration information of the device; a coefficient determination unit 402, configured to determine spatial filtering coefficients based on the receiving antenna configuration, so that when the spatial filtering is performed on signals received by each of antennas in a receiving antenna array and the filtered signals are combined, an equivalent channel time-variant degree for the combined signal is decreased; and a transmitting unit 403, configured to transmit the spatial filtering coefficients to the device.

The coefficient determination unit 402 may have the same structure and function as the coefficient determination unit 201 described in the second embodiment, which is not repeated here. In addition, the apparatus 400 may also store spatial filtering coefficients corresponding to various receiving antenna configurations in advance, and the coefficient determination unit 402 searches according to the receiving antenna configuration.

The apparatus 400 may be located on the base station side for example. The base station may be realized as any type of evolved Node B (eNB). Instead, the base station may be realized as any other types of base stations such as a NodeB and a base transceiver station (BTS). The base station may include a main body (that is also referred to as a base station apparatus) configured to control radio communication, and one or more remote radio heads (RRH) disposed in a different place from the main body. In addition, various types of terminals may each operate as the base station by temporarily or semi-persistently executing a base station function.

<Fifth Embodiment>

In the process of describing the apparatus for wireless communications in the embodiments described above, obviously, some processing and methods are also disclosed. Hereinafter, an overview of the methods is given without repeating some details disclosed above. However, it should be noted that, although the methods are disclosed in a process of describing the apparatus for wireless communications, the methods do not certainly employ or are not certainly executed by the aforementioned components. For example, the embodiments of the apparatus for wireless communications may be partially or completely implemented with hardware and/or firmware, the method for wireless communications described below may be executed by a computer-executable program completely, although the hardware and/or firmware of the electronic device can also be used in the methods.

Figure 9:
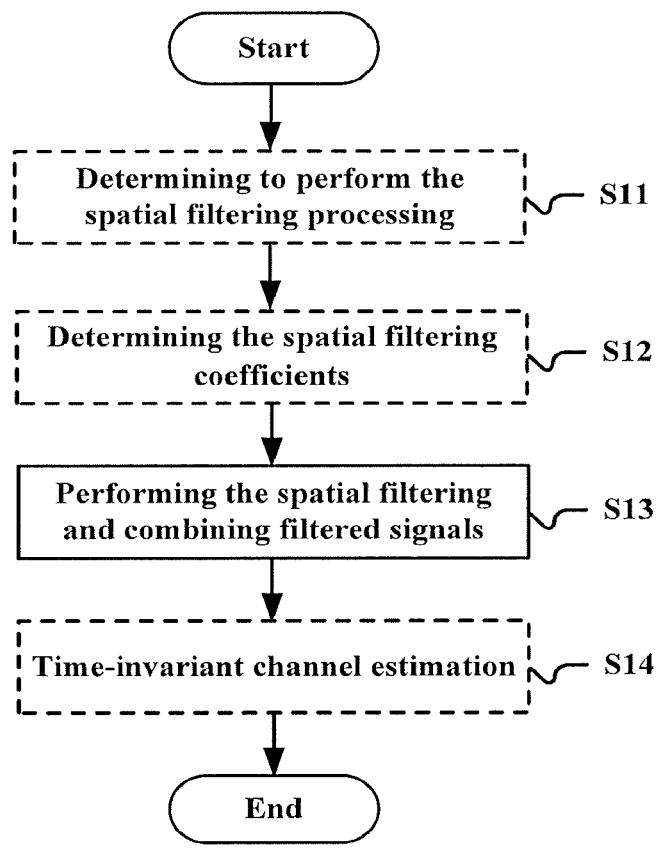
FIG. 9 is a flowchart illustrating a method for wireless communications according to another embodiment of the present application.

FIG. 9 shows a flowchart of a method for wireless communications according to an embodiment of the present application. The method includes: performing spatial filtering on signals received by each of antennas in a receiving antenna array and combining the filtered signals, where coefficients used by the spatial filtering are configured such that an equivalent channel time-variant degree of the combined signal is reduced (S13).

As shown by a dashed line box in FIG. 9, the above method may further include step S11: determining whether to perform spatial filtering processing. In an example, it may be determined based on a speed of a communication terminal relative to a device from which the signals are received. The speed may be determined based on a received reference signal for example.

In another example, in step S11, it may be determined whether to perform the spatial filtering processing based on a trigger signal from the device from which the signals are received. The trigger signal is generated based on the relative speed between the communication terminal and the device, and the relative speed may be determined by the device according to a speed of the apparatus, which is acquired for example from a communication terminal or acquired from a communication network.

As shown in another dashed line box in FIG. 9, the above method may further include step S12: determining coefficients used by the spatial filtering.

In an example, the coefficients may be determined based on a root-mean-square wavenumber spread of a signal that is spatial filtered and combined. In this case, in step S13, wavenumber spectrum shifting is performed on the filtered signals before the filtered signals are combined.

Figure 10:
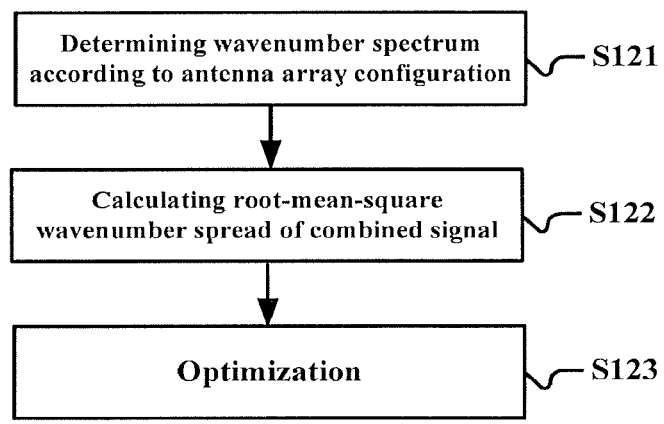
FIG. 10 is a flowchart illustrating sub-steps of step S12 in FIG. 9.

FIG. 10 shows a flowchart of a specific example of determination based on a root-mean-square wavenumber spread of a combined signal. As shown in FIG. 10, step S12 includes: determining a corresponding wavenumber spectrum according to a configuration of a receiving antenna array (S121); calculating, based on the wavenumber spectrum, its root-mean-square wavenumber spread, and calculating, based on a principle that spatial filtered signals are orthogonal to each other in an angular domain, a root-mean-square wavenumber spread of the combined signal (S122); and obtaining optimal coefficients for the spatial filtering by minimizing the root-mean-square wavenumber spread of the combined signal (S123).

For example, in step S123, the optimal coefficients for the spatial filtering may be obtained by using a multi-objective constraint optimization method.

In another example, in step S12, the coefficients used by the spatial filtering may be determined based on the root-mean-square angle spread of the combined signal.

Step S12 may be performed off-line to determine the coefficients used by the spatial filtering in advance. Optionally, in step S12, the coefficients may be determined by reading the coefficients for the spatial filtering already stored in a storage apparatus.

In addition, step S12 may also be performed by receiving the coefficients for the spatial filtering from the device in communication with the communication terminal. In this case, step 12 may further include: transmitting the receiving antenna configuration information to the device.

As shown in another dashed line box in FIG. 9, the above method may further include step S14: estimating parameters of the equivalent channel by using the combined signal as a signal obtained through a time-invariant channel and using a time-invariant channel estimation algorithm.

Figure 11:
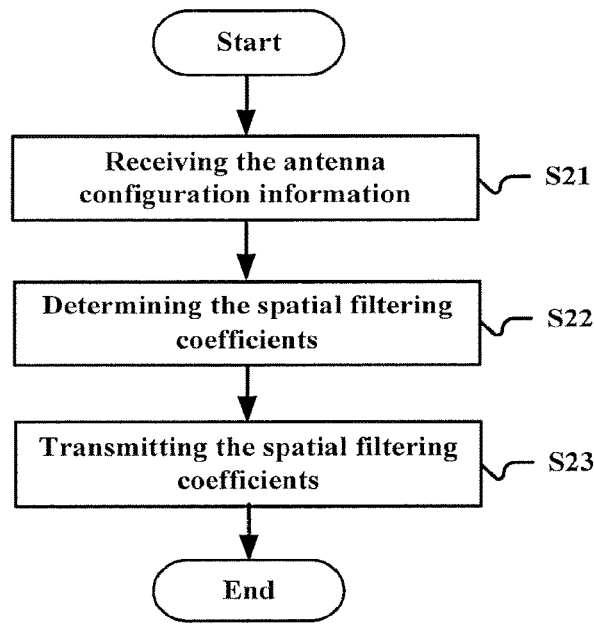
FIG. 11 is a flowchart illustrating a method for wireless communications according to another embodiment of the present application.

Accordingly, FIG. 11 shows a flowchart of a method for wireless communications according to another embodiment of the present application. The method includes: receiving, from a communication device, its receiving antenna configuration information (S21); determining spatial filtering coefficients based on the receiving antenna configuration, so that when the spatial filtering is performed on signals received by each of antennas in a receiving antenna array and the filtered signals are combined, an equivalent channel time-variant degree for the combined signal is decreased (S22); and transmitting the spatial filtering coefficients to the communication device (S23).

With the method according to the present application, the equivalent channel time-variant degree is reduced by spatial filtering, thereby improving the system performance.

It is to be noted that, the above methods can be used separately or in conjunction with each other. The details have been described in detail in the first to fourth embodiments, and are not repeatedly described here.

The basic principle of the present invention has been described above in conjunction with particular embodiments. However, as can be appreciated by those ordinarily skilled in the art, all or any of the steps or components of the method and device according to the invention can be implemented in hardware, firmware, software or a combination thereof in any computing device (including a processor, a storage medium, etc.) or a network of computing devices by those ordinarily skilled in the art in light of the disclosure of the invention and making use of their general circuit designing knowledge or general programming skills.

Moreover, the present invention further discloses a program product in which machine-readable instruction codes are stored. The aforementioned methods according to the embodiments can be implemented when the instruction codes are read and executed by a machine.

Accordingly, a memory medium for carrying the program product in which machine-readable instruction codes are stored is also covered in the present invention. The memory medium includes but is not limited to soft disc, optical disc, magnetic optical disc, memory card, memory stick and the like.

In the case where the present application is realized by software or firmware, a program constituting the software is installed in a computer with a dedicated hardware structure (e.g. the general computer 1200 shown in FIG. 12) from a storage medium or network, wherein the computer is capable of implementing various functions when installed with various programs.

Figure 12:
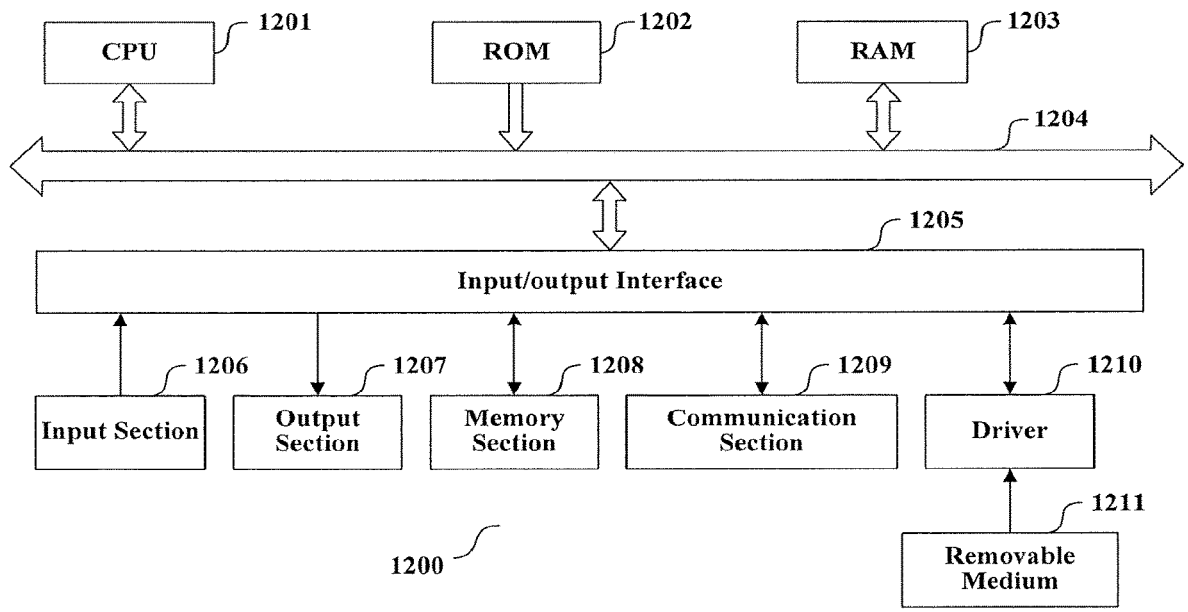
FIG. 12 is an exemplary block diagram illustrating the structure of a general purpose personal computer capable of realizing the method and/or device and/or system according to the embodiments of the present invention.

In FIG. 12, a central processing unit (CPU) 1201 executes various processing according to a program stored in a read-only memory (ROM) 1202 or a program loaded to a random access memory (RAM) 1203 from a memory section 1208. The data needed for the various processing of the CPU 1201 may be stored in the RAM 1203 as needed. The CPU 1201, the ROM 1202 and the RAM 1203 are linked with each other via a bus 1204. An input/output interface 1205 is also linked to the bus 1204.

The following components are linked to the input/output interface 1205: an input section 1206 (including keyboard, mouse and the like), an output section 1207 (including displays such as a cathode ray tube (CRT), a liquid crystal display (LCD), a loudspeaker and the like), a memory section 1208 (including hard disc and the like), and a communication section 1209 (including a network interface card such as a LAN card, modem and the like). The communication section 1209 performs communication processing via a network such as the Internet. A driver 1210 may also be linked to the input/output interface 1205. If needed, a removable medium 1211, for example, a magnetic disc, an optical disc, a magnetic optical disc, a semiconductor memory and the like, may be installed in the driver 1210, so that the computer program read therefrom is installed in the memory section 1208 as appropriate.

In the case where the foregoing series of processing is achieved by software, programs forming the software are installed from a network such as the Internet or a memory medium such as the removable medium 1211.

It should be appreciated by those skilled in the art that the memory medium is not limited to the removable medium 1211 shown in FIG. 12, which has program stored therein and is distributed separately from the apparatus so as to provide the programs to users. The removable medium 1211 may be, for example, a magnetic disc (including floppy disc (registered trademark)), a compact disc (including compact disc read-only memory (CD-ROM) and digital versatile disc (DVD), a magneto optical disc (including mini disc (MD) (registered trademark)), and a semiconductor memory. Alternatively, the memory medium may be the hard discs included in ROM 1202 and the memory section 1208 in which programs are stored, and can be distributed to users along with the device in which they are incorporated.

To be further noted, in the apparatus, method and system according to the invention, the respective components or steps can be decomposed and/or recombined. These decompositions and/or recombinations shall be regarded as equivalent schemes of the invention. Moreover, the above series of processing steps can naturally be performed temporally in the sequence as described above but will not be limited thereto, and some of the steps can be performed in parallel or independently from each other.

Finally, to be further noted, the term "include", "comprise" or any variant thereof is intended to encompass nonexclusive inclusion so that a process, method, article or device including a series of elements includes not only those elements but also other elements which have been not listed definitely or an element(s) inherent to the process, method, article or device. Moreover, the expression "comprising a(n)" in which an element is defined will not preclude presence of an additional identical element(s) in a process, method, article or device comprising the defined element(s)" unless further defined.

Although the embodiments of the invention have been described above in detail in connection with the drawings, it shall be appreciated that the embodiments as described above are merely illustrative but not limitative of the invention. Those skilled in the art can make various modifications and variations to the above embodiments without departing from the spirit and scope of the invention. Therefore, the scope of the invention is defined merely by the appended claims and their equivalents.

The invention claimed is:

1. An apparatus for wireless communications, comprising:
   circuitry configured to
   perform spatial filtering on signals received by each of antennas in a receiving antenna array, and combine the filtered signals to generate a combined signal, wherein coefficients used by the spatial filtering are configured such that an equivalent channel time-variant degree for the combined signal is decreased; and
   receive a trigger signal from a device from which the signals are received, the trigger signal triggering the circuitry to perform the spatial filtering processing, wherein the trigger signal is generated based on a relative speed between the device from which the signals are received and the apparatus, and the relative speed is determined by the device according to a speed of the apparatus, which is acquired from the apparatus, wherein the circuitry is further configured to determine, based on a root-mean-square wavenumber spread of the signal which is spatial filtered and combined, the coefficients used by the spatial filtering determine a corresponding wavenumber spectrum according to a configuration of the receiving antenna array;

calculate, based on the wavenumber spectrum, the root-mean-square wavenumber spread of the wavenumber spectrum, and calculate, based on a principle that the spatial filtered signals are orthogonal to each other in an angle domain, the root-mean-square wavenumber spread of the combined signal; and obtain optimal coefficients for the spatial filtering by minimizing the root-mean-square wavenumber spread of the combined signal.

2. The apparatus according to claim 1, wherein the circuitry is further configured to perform wavenumber spectrum shifting on the filtered signals before combining the filtered signals.

3. The apparatus according to claim 1, wherein the circuitry is configured to obtain the optimal coefficients for the spatial filtering by using a multi-objective constraint optimization method.

4. The apparatus according to claim 1, wherein the circuitry is further configured to determine, based on a root-mean-square angle spread of the combined signal, the coefficients used by the spatial filtering.

5. The apparatus according to claim 1, wherein the circuitry is configured to perform an off-line operation, to determine the coefficients used by the spatial filtering in advance.

6. The apparatus according to claim 1, wherein the circuitry is further configured to estimate parameters of the equivalent channel by using the combined signal as a signal obtained through a time-invariant channel and using a time-invariant channel estimation algorithm.

7. A method for wireless communications at an apparatus, comprising:

performing spatial filtering on signals received by each of antennas in a receiving antenna array, and combining the filtered signals to generate a combined signal, wherein coefficients used by the spatial filtering are configured such that an equivalent channel time-variant degree for the combined signal is decreased; and receiving a trigger signal from a device from which the signals are received, the trigger signal triggering the spatial filtering unit to perform the spatial filtering processing, wherein the trigger signal is generated based on a relative speed between the device from which the signals are received and the apparatus, and the relative speed is determined by the device according to a speed of the apparatus, which is acquired from the apparatus. the method further comprising determining, based on a root-mean-square wavenumber spread of the signal which is spatial filtered and combined, the coefficients used by the spatial filtering determining a corresponding wavenumber spectrum according to a configuration of the receiving antenna array, calculating, based on the wavenumber spectrum, the root-mean-square wavenumber spread of the wavenumber spectrum, and calculate, based on a principle that the spatial filtered signals are orthogonal to each other in an angle domain, the rood-mean-square wavenumber spread of the combined signal, and obtaining optimal coefficients for the spatial filtering by minimizing the root-mean-square wavenumber spread of the combined signal.

\* \* \* \* \*